US010222608B2

United States Patent
Iwase et al.

(10) Patent No.: US 10,222,608 B2
(45) Date of Patent: Mar. 5, 2019

(54) MICRO DRIVE DEVICE AND MICRO DEVICE USING SAME

(71) Applicant: WASEDA UNIVERSITY, Tokyo (JP)

(72) Inventors: Eiji Iwase, Tokyo (JP); Chisa Iino, Tokyo (JP)

(73) Assignee: WASEDA UNIVERSITY, Tokyo (JP)

(*) Notice: Subject to any disclaimer, the term of this patent is extended or adjusted under 35 U.S.C. 154(b) by 60 days.

(21) Appl. No.: 15/280,557

(22) Filed: Sep. 29, 2016

(65) Prior Publication Data
US 2017/0017074 A1 Jan. 19, 2017

Related U.S. Application Data

(63) Continuation of application No. PCT/JP2015/060279, filed on Mar. 31, 2015.

(30) Foreign Application Priority Data

Mar. 31, 2014 (JP) .................................. 2014-074963

(51) Int. Cl.
G02B 26/08 (2006.01)
G02B 26/10 (2006.01)
B81B 3/00 (2006.01)

(52) U.S. Cl.
CPC ............ *G02B 26/0833* (2013.01); *B81B 3/00* (2013.01); *B81B 3/0062* (2013.01);
(Continued)

(58) Field of Classification Search
CPC ............ G02B 26/0833; G02B 26/0841; G02B 26/085; G02B 26/101; B81B 3/00; B81B 3/0062; B81B 2201/042
(Continued)

(56) References Cited

U.S. PATENT DOCUMENTS 9,003,882 B1* 4/2015 Ayazi .................. G01C 19/574
73/504.03
2007/0115072 A1* 5/2007 Kato .................... G02B 26/085
331/176
(Continued)

FOREIGN PATENT DOCUMENTS

JP 2010-8611 A 1/2010
JP 2011-175043 A 9/2011
(Continued)

OTHER PUBLICATIONS

International Search Report dated Jun. 16, 2015, issued in counterpart International Application No. PCT/JP2015/060279 (2 pages).
(Continued)

*Primary Examiner* — Frank G Font
(74) *Attorney, Agent, or Firm* — Westerman, Hattori, Daniels & Adrian, LLP (57) ABSTRACT

Provided is a micro drive unit, which is capable of performing multi-axis drive, the micro drive unit including: a movable object; and at least one pair of beams configured to pivotally support the movable object and formed only in one direction, the movable object being configured to rotate or translate in an x-axis direction, a y-axis direction, and a z-axis direction when the at least one pair of beams is twisted or bent at one or a plurality of resonant frequencies of the at least one pair of beams, thereby being capable of simultaneously avoiding upsizing and complication of the structure. And by incorporating the micro drive unit, a micro device capable of achieving multi-axis drive can be manufactured.

9 Claims, 11 Drawing Sheets

(52) U.S. Cl.
CPC ....... *G02B 26/085* (2013.01); *G02B 26/0841* (2013.01); *G02B 26/101* (2013.01); *B81B 2201/042* (2013.01)

(58) Field of Classification Search
USPC .............. 359/198.1–199.4, 200.6–200.8, 359/212.1–215.1, 226.2, 849
See application file for complete search history.

(56) References Cited

U.S. PATENT DOCUMENTS

| | | | |
|---|---|---|---|
| 2007/0144867 A1* | 6/2007 | Torashima | B81B 3/0078 198/346.1 |
| 2008/0024038 A1* | 1/2008 | Chen | H02N 10/00 310/317 |
| 2010/0079837 A1 | 4/2010 | Akedo et al. | |
| 2011/0170157 A1 | 7/2011 | Ueda et al. | |
| 2011/0205602 A1 | 8/2011 | Mizoguchi | |
| 2013/0278984 A1* | 10/2013 | Honda | G02B 26/0858 359/199.1 |
| 2015/0260519 A1* | 9/2015 | Boysel | G01C 19/5712 257/415 |

FOREIGN PATENT DOCUMENTS

| | | |
|---|---|---|
| JP | 2011-191589 A | 9/2011 |
| JP | 2012-163828 A | 8/2012 |
| WO | 2008/038649 A1 | 4/2008 |

OTHER PUBLICATIONS

Koh et al., "A 2-D MEMS scanning mirror based on dynamic mixed mode excitation of piezoelectric PZT thin film S-shaped actuator", Optics Express, vol. 19, No. 15, pp. 1-13, Jul. 18, 2011.
Yalcinkaya et al., "Two-Axis Electromagnetic Microscanner for High Resolution Displays", Journal of Microelectromechanical Systems, vol. 15, No. 4, pp. 1-9, Aug. 2006.

* cited by examiner

FIG.4A z-AXIS TRANSLATION

FIRST BEAM 14: BENDING
SECOND BEAM 15: BENDING

MICRO DRIVE DEVICE AND MICRO DEVICE USING SAME

CROSS-REFERENCE TO RELATED APPLICATIONS

This application is a continuation application of International Application PCT/JP2015/060279 filed on Mar. 31, 2015 and designated the U.S., which claims the benefit of priority of the prior Japanese Patent Application No. 2014-074963, filed on Mar. 31, 2014, the entire contents of which are incorporated herein by reference.

FIELD

The embodiments discussed herein are related to a micro drive unit (MICRO DRIVE DEVICE) and a micro device using the same, for example, a microminiaturized mirror drive unit including a movable object formed of a mirror.

BACKGROUND

Micro-electro-mechanical systems (MEMS) are used in an optical element of a projector, fine nozzles formed in a head portion of an ink jet printer, and various sensors such as a pressure sensor, an acceleration sensor, and a flow rate sensor. MEMS are one of technologies for downsizing and increasing the performance of a micro device having those various sensors incorporated therein.

Figure 17:
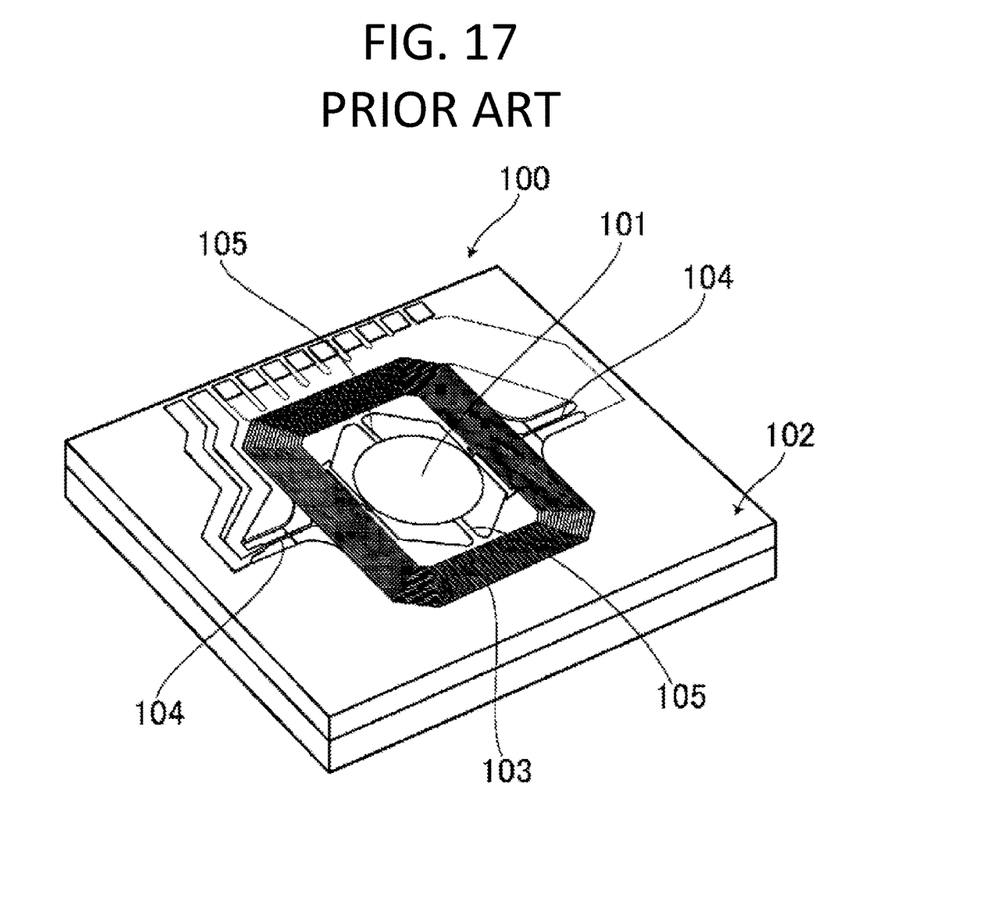
FIG. 17 is a view for illustrating a light scanner including a related-art micro drive unit having gimbal structure.

As an example of such a microdevice, a MEMS light scanner is illustrated in FIG. 17. As illustrated in FIG. 17, as a MEMS light scanner 100 to be incorporated in, for example, a laser printer, a fiberscope, a head mounted display, and an optical switch, there is known one including a mirror 101 having a diameter of about 1 mm, and a micro drive unit 102 configured to drive the mirror 101 (ex. Arda D. Yalcinkaya et al., "Two-Axis Electromagnetic Microscanner for High Resolution Displays," Journal of Microelectromechanical Systems, vol. 15, no. 4, pp. 786-793, 2006).

This micro drive unit 102 is a drive unit to be driven in two axes by an electromagnetic drive system, and has double gimbal structure including a frame-shaped outer movable plate 103, outer beams 104 configured to pivotally support the outer movable plate 103 to a semiconductor substrate in a rotatable manner, and inner beams 105, which have an axial direction orthogonal to that of the outer beams 104, and are configured to pivotally support the mirror 101 serving as an inner movable plate in a rotatable manner.

In this case, the micro drive unit 102 illustrated in FIG. 17 is configured such that one beam causes rotation in one axis with a Lorentz force generated by a current, which flows through a coil formed on the outer beams, and a magnetic field, which is applied from the outside. In order to enable such two-axis drive (two degrees of freedom), the outer movable plate 103 is required on the outer side of the mirror 101. Therefore, there has been a problem in that the drive unit is upsized. When the degree of freedom is intended to be further added, a movable plate and beams are required to be added on the outer side of the outer movable plate 103. Thus, in the micro drive unit using the gimbal structure, there has been a problem in that the drive unit is upsized and complicated.

In view of this, in order to solve such problems, there has been proposed a piezoelectric drive MEMS light scanner capable of performing two-axis drive with one beam (ex. Kah How Koh et al., "A 2-D MEMS scanning mirror based on dynamic mixed mode excitation of a piezoelectric PZT thin film S-shaped actuator," OPTICAL EXPRESS, Vol. 19, No. 15, pp. 13812-13824). The drive unit used in this light scanner has such structure that one S-shaped beam configured to pivotally support the mirror is bent by a resonant frequency $\omega_B$ and is twisted by a resonant frequency $\omega_T$. However, even in this drive unit, no consideration is given to the structure for further adding the degree of freedom, and this drive unit cannot achieve three-axis drive (three degrees of freedom) or more unless the structure is changed.

As an example of other micro devices, in Japanese Laid-open Patent Publication No. 2011-191589 A, there has been proposed a one-axis micro mirror having single gimbal structure including one pair of torsion bars each connected to a support beam having unimorph structure in which upper and lower piezoelectric element layers are formed on one surface at both longitudinal ends, and a mirror to be pivotally supported by the one pair of torsion bars in a rotatable and oscillatable manner.

SUMMARY

According to one aspect of the present invention, there is provided a micro drive unit, which is capable of performing multi-axis drive, the micro drive unit including, a movable object, and at least one pair of beams configured to pivotally support the movable object and formed only in one direction, the movable object being configured to rotate or translate in an x-axis direction, a y-axis direction, and a z-axis direction when the at least one pair of beams is twisted or bent at one or a plurality of resonant frequencies of the at least one pair of beams.

According to another aspect of the present invention, there is provided a micro device comprising the micro drive unit. By incorporating the micro drive unit of the present invention, a micro device capable of achieving multi-axis drive can be manufactured.

DESCRIPTION OF EMBODIMENTS

First Embodiment

[Configuration of Micro Drive Unit]

Figure 1:
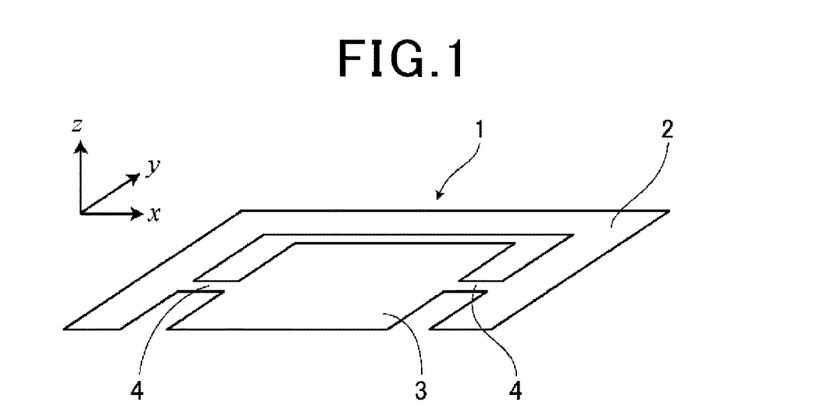
FIG. 1 is a schematic view of a micro drive unit.

Now, an embodiment of the present invention is described with reference to the drawings as appropriate. FIG. 1 is a model view for schematically illustrating a basic configuration of a micro drive unit 1 according to the present invention. The micro drive unit 1 includes a movable object 3, a frame portion 2 formed so as to surround the movable object 3, and at least one pair of beams 4 configured to pivotally support the frame portion 2 and the movable object 3. The micro drive unit 1 is designed such that the beams 4 are formed only in one direction, and the beams 4 resonate at one or a plurality of resonant frequencies of the shape of those beams 4. Thus, the beams 4 are twisted or bent to cause rotation or translation of the movable object 3 in x-axis, y-axis, and z-axis directions. In this manner, a configuration capable of performing multi-axis drive is obtained. This micro drive unit 1 is formed thin to have a thickness of from about 1 μm to about 1,000 μm, for example. Illustration of a drive portion configured to drive the movable object 3 is omitted.

[Background of Operation of Micro Drive Unit by Resonant Frequency]

Figure 2:
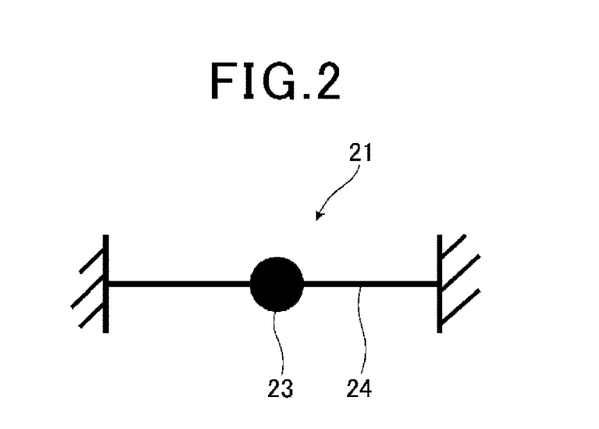
FIG. 2 is a schematic diagram of a simplified model.

FIG. 2 is a schematic view of a simplified model 21. The simplified model 21 is a model for describing a technical feature of the micro drive unit 1. As illustrated in FIG. 2, the simplified model 21 is a model that is simplified to include one movable object 23 and one pair of beams 24 with respect to one axis. At this time, in the simplified model 21, the movable object 23 is regarded as a point mass, and the mass of the beams 24 is ignored.

When the resonant frequency of this simplified model 21 is obtained based on an energy method, a bending resonant frequency $f_1$ and a torsional resonant frequency $f_2$ are represented by the following expressions.

$$f_1 = \frac{\omega}{2\pi} = \frac{\pi}{2l}\sqrt{\frac{2EI}{m_m l}} \text{ Hz,} \quad (1)$$

$$f_2 = \frac{1}{2\pi}\sqrt{\frac{GI_p}{IJ_m}} \text{ Hz,} \quad (2)$$

In this case, in the simplified model 21, the movable object 23 has a mass of $m_m$ and a moment of inertia of $J_m$. The beams 24 have both fixed ends, a beam width of w, a thickness of t, an entire length of l, a Young's modulus of E, a modulus of rigidity of G, a moment of inertia of beam area of I, and a polar moment of inertia of area of $I_p$.

In this case, E and G are constants determined depending on the material of the beams 24, and the mass $m_m$ and the moment of inertia $J_m$ of the movable object 23 are constants determined depending on the shape and the material of the movable object 23. Further, when the beams have a rectangular sectional shape, $I=wt^3/12$ and $I_p=wt^3/12+tw^3/12$ are obtained. Assuming that t is the same in any part of the beam, Expressions (1) and (2) can be rewritten as follows.

$$f_1 \propto \sqrt{\frac{w}{l^1}} = \frac{w^{\frac{1}{2}}}{l^{\frac{3}{2}}} \quad (3)$$

$$f_2 \propto \frac{w^{\frac{1}{2}}}{l^{\frac{1}{2}}} = \frac{w^{\frac{1}{2}}}{l^{\frac{1}{2}}} \quad (4)$$

Therefore, it is found that, in this simplified model 21, during bending, the influence of the entire length l is larger than those of other parameters, and during torsion, the influence of the beam width w is larger than those of other parameters. By appropriately setting the values of the beam width w and the entire length l in Expressions (3) and (4), the resonant frequencies for bending and torsion can be designed. In view of this, the inventors of the present invention have found that, as described above, the resonant frequencies for bending and torsion can be designed by changing the shape of the beam.

[Details of Micro Drive Unit]

The frame portion 2 is formed into a rectangular shape so as to surround the movable object 3. One beam 4 is fixed to substantially the center of one side, and the other beam 4 is fixed also to one opposing side. The movable object 3 can be supported via this pair of beams 4. In this case, the one pair of beams 4 is fixed to the frame portion 2, but second beams to be described later may be fixed to the frame portion 2, and the movable object 3 may be supported via the second beams and the beams 4. In this embodiment, the frame portion 2 is formed into a rectangular shape, but the present invention is not limited thereto. The micro drive unit of the present invention can be changed depending on the shape of the device into which the micro drive unit is incorporated, and may have, for example, a circular shape.

The movable object 3 is an object that performs rotation or translation movement when the beams 4 are twisted or bent. The movable object 3 has a shape and a function that differ depending on the application of the micro drive unit 1. The movable object 3 is supported by the frame portion 2 via the one pair of beams 4 by fixing one end of each of the beams 4 to the movable object 3 and fixing the other end of each of the beams 4 to one side of the frame portion 2 such that the one pair of beams 4 is arranged in a straight line across the movable object 3, that is, such that the one pair of beams 4 is in one direction.

In FIG. 1, the movable object 3 has a rectangular shape, but the present invention is not particularly limited thereto. An appropriate shape can be employed depending on the application of the micro drive unit 1. For example, when the micro drive unit 1 is used in a light scanner, the movable object 3 or a part thereof may be a plate-like or circular mirror. Further, depending on the application of the micro drive unit 1, instead of a planar shape, for example, a three-dimensional shape whose center is swelled may be employed. Further, the movable object 3 or a part thereof may be a lens or a polarizing element.

The movable object 3 has shape parameters depending on the shape, such as a thickness, a length, and a radius. By appropriately changing those shape parameters, the resonant frequency of the beam 4 can be changed. Further, also by changing the material for forming the movable object 3, the resonant frequency of the beam 4 can be changed.

The beam 4 is fixed to the movable object 3 and one side of the frame portion 2. The beam 4 is fixed to the frame portion 2, and hence the beam 4 itself does not rotate or translate, but resonates at a resonant frequency corresponding to the degree of freedom to cause torsion in the longitudinal direction or predetermined bending. The movable object 3 is rotated and translated through such movement of the beam 4. Therefore, the beam 4 may move such as to pivotally support the movable object 3. The beam 4 is only required to be formed so as to be fixed to the frame portion 2. For example, one pair of beams 4 may be formed in one direction across the movable object 3 so as to be arranged in a straight line along the x-axis direction. Further, for example, three beams 4 may be formed radially at intervals of 120° about the movable object 3. Further, for example, the beam 4 may have a curved shape instead of a straight line shape. Further, for example, the beam 4 may be fixed at a corner of the frame portion 2 instead of one side of the frame portion 2 to be formed on a diagonal line of the frame portion 2.

By changing shape parameters such as a beam width, a length, a thickness, the number of divisions, and a beam interval so that the beam 4 may resonate at a plurality of resonant frequencies depending on the movement of the movable object 3, the resonant frequency can be controlled. Further, the shape of the beam 4 is basically an elongated plate shape because of the easiness in manufacture, but other shapes may be employed depending on the necessary resonant frequency. A plurality of beams 4 may be formed. The change of the shape parameter includes dividing one beam 4 into a plurality of parts. For example, the beam 4 may be divided in parallel such that the beam width in the case of one beam 4 and the total of the beam widths of a plurality of beams are the same. In this case, the number of divisions refers to the number of a plurality of divided beams, and the beam interval refers to an interval between the beams 4 when a plurality of beams 4 are formed.

The micro drive unit 1 is formed from a Si substrate, and the movable object 3, the frame portion 2, and the beams 4 are made of Si. It is preferred to use a silicon on insulator (SOI) substrate, but substrates of other materials can be used as long as the material can be subjected to microfabrication. Further, in order to form the frame portion 2, the movable object 3, and the beam 4 of different materials, for example, other materials such as metal, semiconductor, and organic substances, or a laminate of those materials may be used. This point is described later as a third embodiment of the present invention.

Second Embodiment

[Micro Drive Unit Including First Beams and Second Beams]

The inventors of the present invention have found that, as specific structure of the beams of the micro drive unit described in the first embodiment, when structure including first beams formed in a first direction and second beams formed in a second direction is provided, and when the first beams and the second beams are arranged so as to be orthogonal to each other, the resonant frequency for each of x-axis rotation, y-axis rotation, and z-axis translation can be easily designed by changing the beam shapes of the first beams and the second beams. In this case, the beam shape mainly refers to the beam width, the length, the number of divisions, and the beam interval.

Figure 3:
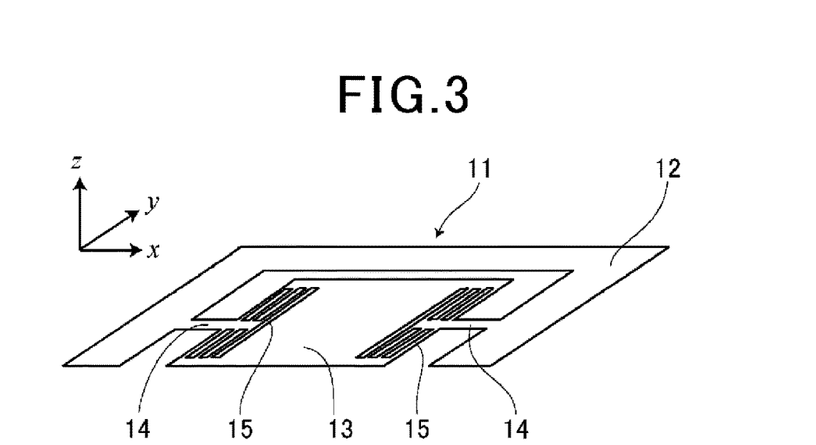
FIG. 3 is a schematic view of the micro drive unit including first beams and second beams.

According to a second embodiment of the present invention, the micro drive unit includes the first beams and the second beams. A micro drive unit 11 as illustrated in FIG. 3 includes at least one second beam 15 formed on a first beam 14. A plurality of the second beams 15 are arranged from the tip end of the first beam 14 on the movable object 13 side so as to be orthogonal to the first beam 14. It is only required that at least one second beam 15 be fixed to the first beam 14. Further, the second beam 15 can be formed in a direction different from the direction of the first beam 14, and is not always necessary to be orthogonal to the first beam 14. Depending on the application of the micro drive unit, for example, the second beam 15 may be arranged at an angle of 45° with respect to the direction of the first beam 14. Further, for example, the second beam 15 may have a curved shape instead of a straight line shape. Further, for example, both or one of the first beam 14 and the second beam 15 may be divided.

The second beam 15 is configured to resonate at a resonant frequency fixed to the first beam 14 to cause torsion in the longitudinal direction or predetermined bending. Thus, in combination with the torsion and bending of the first beam 14, the second beam 15 causes the movable object 3 to rotate or translate. That is, the second beam 15 is formed on the first beam 14 so as to increase the range of the settable resonant frequency.

Similarly to the first beam 14, by changing the shape parameters such as the beam width, the length, the beam interval, and the thickness so that the second beam 15 may resonate at a plurality of resonant frequencies depending on movement of a movable object 13, the resonant frequency can be controlled. Further, the shape of the second beam 15 is basically an elongated plate shape because of the easiness in manufacture, but other shapes may be employed depending on the necessary resonant frequency.

[Summary of Operation of Micro Drive Unit by Resonant Frequency]

Figure 4A:
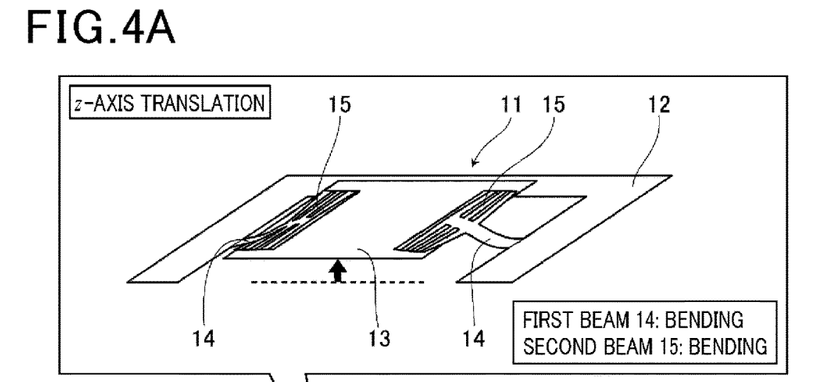
FIG. 4A is a conceptual view of the micro drive unit causing z-axis translation.
Figure 4B:
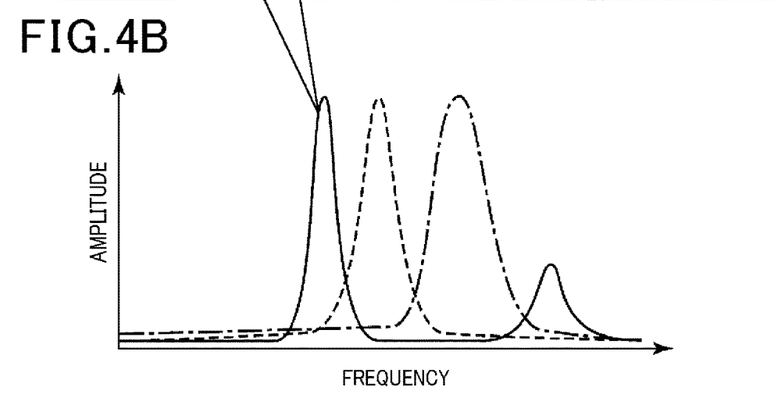
FIG. 4B is a graph for showing a relationship between a frequency applied to the micro drive unit and its amplitude.

Description is made of the summary of the operation of the micro drive unit 11 capable of causing rotation in the x-axis direction, rotation in the y-axis direction, and translation in the z-axis direction. FIG. 4A and FIG. 4B are conceptual diagrams for illustrating the relationship between the resonant frequency and the micro drive unit 11 (z-axis translation). FIG. 4A is a conceptual view of the micro drive unit causing z-axis translation, and FIG. 4B is a graph for showing a relationship between a frequency applied to the micro drive unit and its amplitude. In the micro drive unit 11 illustrated in FIG. 4A, the second beams 15 are arranged so as to be orthogonal to the first beams 14, and the shape parameters of each of the first beams 14 and the second beams 15 are appropriately set. In this manner, the micro drive unit 11 is designed to have the maximum amplitude of the movable object 13 at three different frequency peaks.

As shown in FIG. 4B, when the frequency indicated by the solid line is applied to the first beams 14 and the second beams 15, the one pair of first beams 14 is bent to the upper side in the z-axis direction from the frame portion 12 side toward the movable object 13 side, and the second beams 15 are each bent to the upper side in the z-axis direction as separating from the vicinity of the first beams 14, to thereby assist the first beams 14 to obtain the translational movement in the z-axis direction. As a result, the micro drive unit 11 can cause translation in the z-axis direction.

Figure 5A:
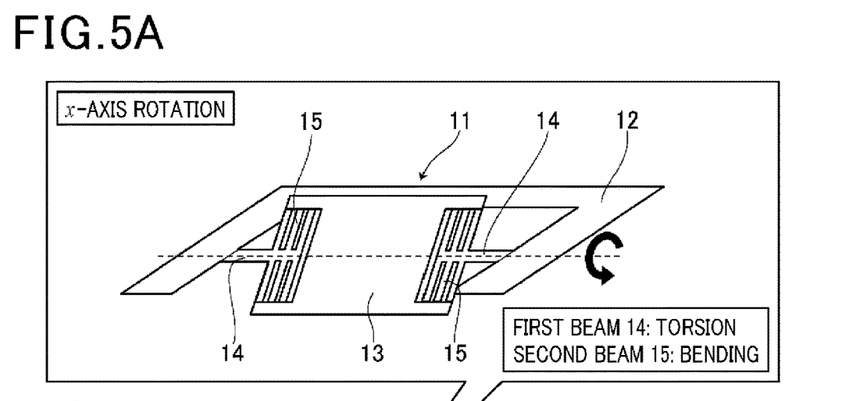
FIG. 5A is a conceptual view of the micro drive unit causing x-axis rotation.
Figure 5B:
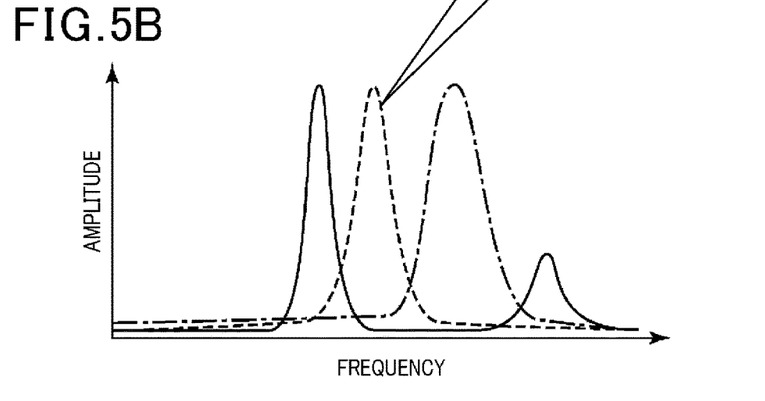
FIG. 5B is a graph for showing a relationship between a frequency applied to the micro drive unit and its amplitude.

FIG. 5A and FIG. 5B are conceptual diagrams for illustrating the relationship between the resonant frequency and the micro drive unit 11 (x-axis rotation). FIG. 5A is a conceptual view of the micro drive unit causing x-axis rotation, and FIG. 5B is a graph for showing a relationship between a frequency applied to the micro drive unit and its amplitude. As shown in FIG. 5B, when the center frequency indicated by the dotted line is applied to the first beams 14 and the second beams 15, both of the first beams 14 are twisted in the direction of the arrow about the x-axis. The second beams 15 are each bent so that the upstream side in the rotational direction is protruded and the downstream side in the rotational direction is recessed about the first beam 14, to thereby assist the first beams 14 to obtain the rotational movement in the x-axis direction. As a result, the micro drive unit 11 can cause rotation in the x-axis direction.

Figure 6A:
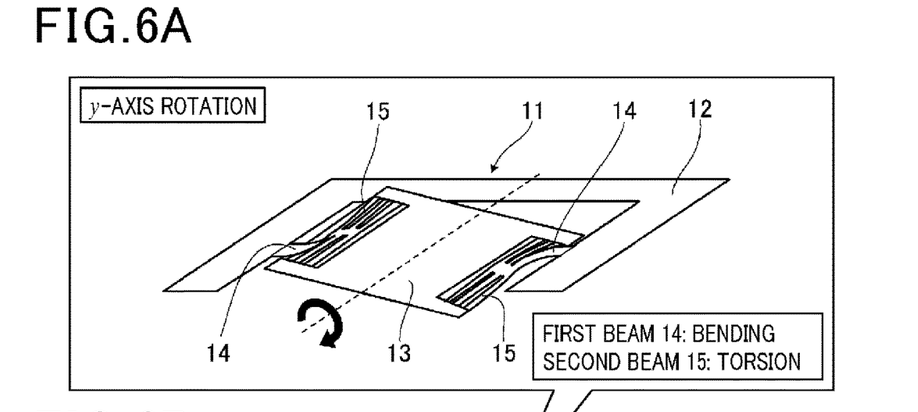
FIG. 6A is a conceptual view of the micro drive unit causing y-axis rotation.
Figure 6B:
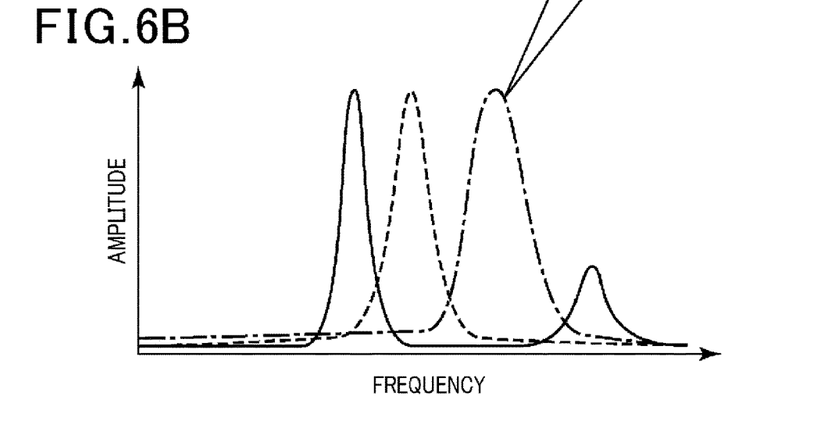
FIG. 6B is a graph for showing a relationship between a frequency applied to the micro drive unit and its amplitude.

FIG. 6A and FIG. 6B are conceptual diagrams for illustrating the relationship between the resonant frequency and the micro drive unit 11 (y-axis rotation). FIG. 6A is a conceptual view of the micro drive unit causing y-axis rotation, and FIG. 6B is a graph for showing a relationship between a frequency applied to the micro drive unit and its amplitude. As shown in FIG. 6B, when the highest frequency indicated by the dashed-dotted line is applied to the first beams 14 and the second beams 15, one first beam 14 is bent to the upper side in the z-axis direction from the frame portion 12 side toward the movable object 13 side, and the other first beam 14 is bent to the lower side in the z-axis direction from the frame portion 12 side toward the movable object 13 side. Further, the second beams 15 are each twisted in the direction of the arrow about the y-axis direction, to thereby assist the first beams 14 to obtain the rotational movement in the y-axis direction. As a result, the micro drive unit 11 can cause rotation in the y-axis direction.

In the micro drive unit 11, the first beams 14 and the second beams 15 are arranged so as to be orthogonal to each other. Thus, only with one pair of beams including the first beam 14 and the second beam 15, three-axis drive (three degrees of freedom), that is, rotation in the x-axis direction, rotation in the y-axis direction, and translation in the z-axis direction can be performed. In addition, the micro drive unit 11 is designed such that the first beam 14 and the second beam 15 are arranged so as to be orthogonal to each other, and those beams resonate at one or a plurality of resonant frequencies to cause torsion or bending. Therefore, the micro drive unit 11 can perform drive by one control mechanism. Further, in the micro drive unit 11, by appropriately setting the shape parameters of the movable object 13, the first beam 14, and the second beam 15, different resonant frequencies can be appropriately set for the respective degrees of freedom of the movable object 13. Further, the micro drive unit 11 can have the control mechanism located at an optimum position depending on the usage application, the design, and the shape of the micro drive unit 11. In view of those points, the micro drive unit of the invention of the subject application can increase the degree of freedom in design of the drive unit and can achieve microminiaturization. Further, the micro drive unit of the invention of the subject application, which can increase the degree of freedom in design and achieve microminiaturization, can significantly widen its usage application.

In the following, assuming usage of a light scanner including the micro drive unit according to the second embodiment, which includes the first beams and the second beams that are orthogonal to each other and is capable of causing rotation in the x-axis direction, rotation in the y-axis direction, and translation in the z-axis direction, the shape and the shape parameters that actually adapt to the usage of the light scanner are set, to thereby manufacture a micro drive unit for a light scanner.

[Determination of Shape of Micro Drive Unit]

Figure 7:
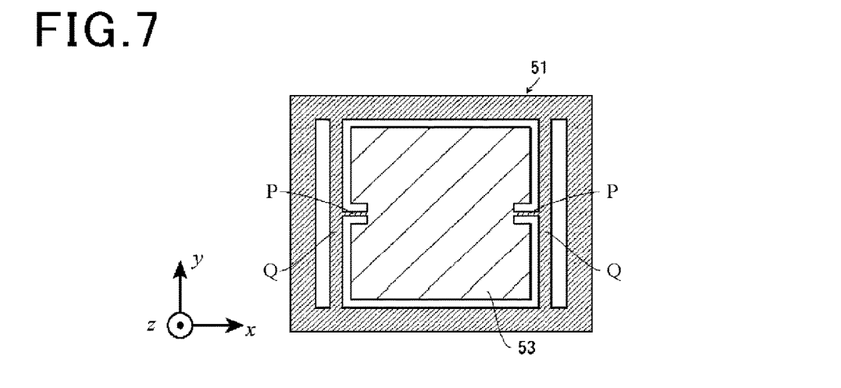
FIG. 7 is a schematic view of a model of a micro drive unit for a light scanner.
Figure 8:
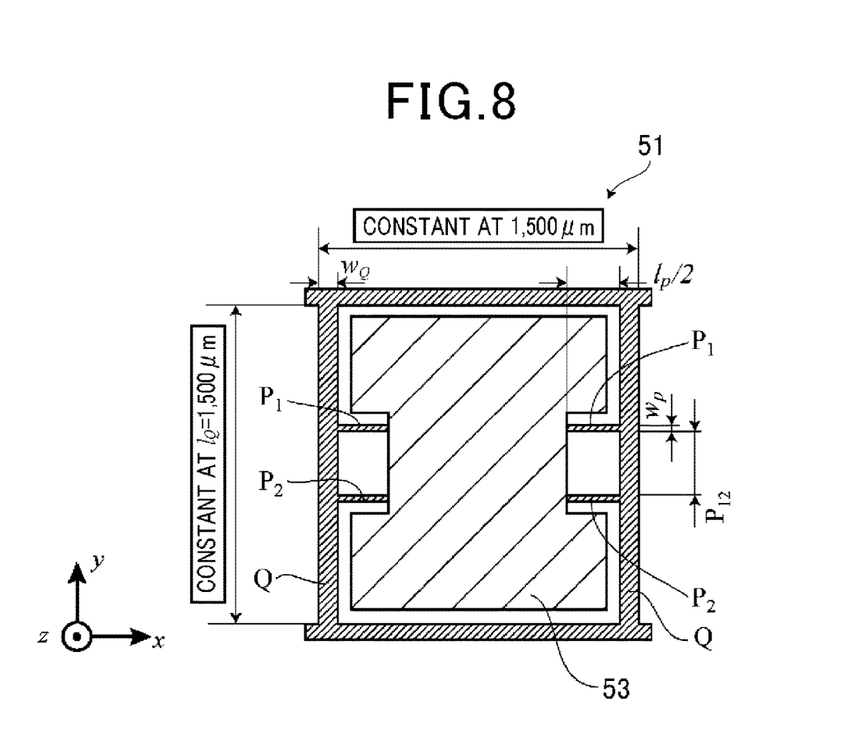
FIG. 8 is a schematic view of a model of the micro drive unit for a light scanner.

In this case, in order to increase as much as possible an aperture ratio that is an area occupying ratio of the mirror portion of the light scanner, and to appropriately set different resonant frequencies for the respective degrees of freedom, that is, to increase the peak interval between the respective resonant frequencies to enable independent control of each degree of freedom, the shape of a micro drive unit 51 for a light scanner illustrated in FIG. 7 and FIG. 8 is determined. The micro drive unit 51 for a light scanner illustrated in FIG. 7 includes a mirror portion 53 formed into an I (in capital) shape in alphabet, which serves as the movable object, one pair of first beams P, and a frame portion configured to support second beams Q formed so as to be orthogonal to the first beams P. The micro drive unit 51 for a light scanner illustrated in FIG. 8 includes first beams $P_1$ and $P_2$ obtained by dividing the first beam P illustrated in FIG. 7 into two parts.

In the micro drive unit 51 for a light scanner illustrated in FIG. 8, the beam width of each of the first beam $P_1$ and the first beam $P_2$ is represented by a beam width $W_P$ (those have the same width because the first beam P is divided), the interval between the first beam $P_1$ and the first beam $P_2$ is represented by an interval $P_{12}$, and the entire length of the first beams obtained by adding the lengths of the one pair of first beams arranged across the mirror portion 53 is represented by a length $l_P$. Further, the beam width of each of the second beams Q fixed at both ends is represented by $W_Q$. In this embodiment, with use of those defined shape parameters, the resonant frequency of the micro drive unit 51 for a light scanner is optimized. The following description is given assuming that the mirror portion 53 is the movable object, but, for example, even when a movable object for other applications is used, similar methods can be executed.

[Method of Optimizing Resonant Frequency of Micro Drive Unit]

In a method of optimizing the resonant frequency in this micro drive unit 51 for a light scanner, in order to acquire the shape parameters for optimally obtaining different resonant frequencies, while changing the shape parameters that are given first, a finite element analysis method is performed to determine final shape parameters. In this embodiment, the finite element analysis method is used to determine the shape parameters, but the present invention is not limited thereto, and other analysis methods can be used. For example, a micro drive unit 51 for a light scanner whose shape parameters are actually changed may be manufactured, to thereby determine the final shape parameters.

In the finite element analysis of the micro drive unit 51 for a light scanner, in order to simplify the calculation, the symmetry of the x-axis rotation and the y-axis rotation is maintained, and further the entire device is formed into a square shape. One side of the square is set to 1,500 μm, and the thickness of each of the mirror portion and the beam is set constant to t=30 μm. Thus, the length of the second beam Q is $l_Q$=1,500 μm.

Figure 9:
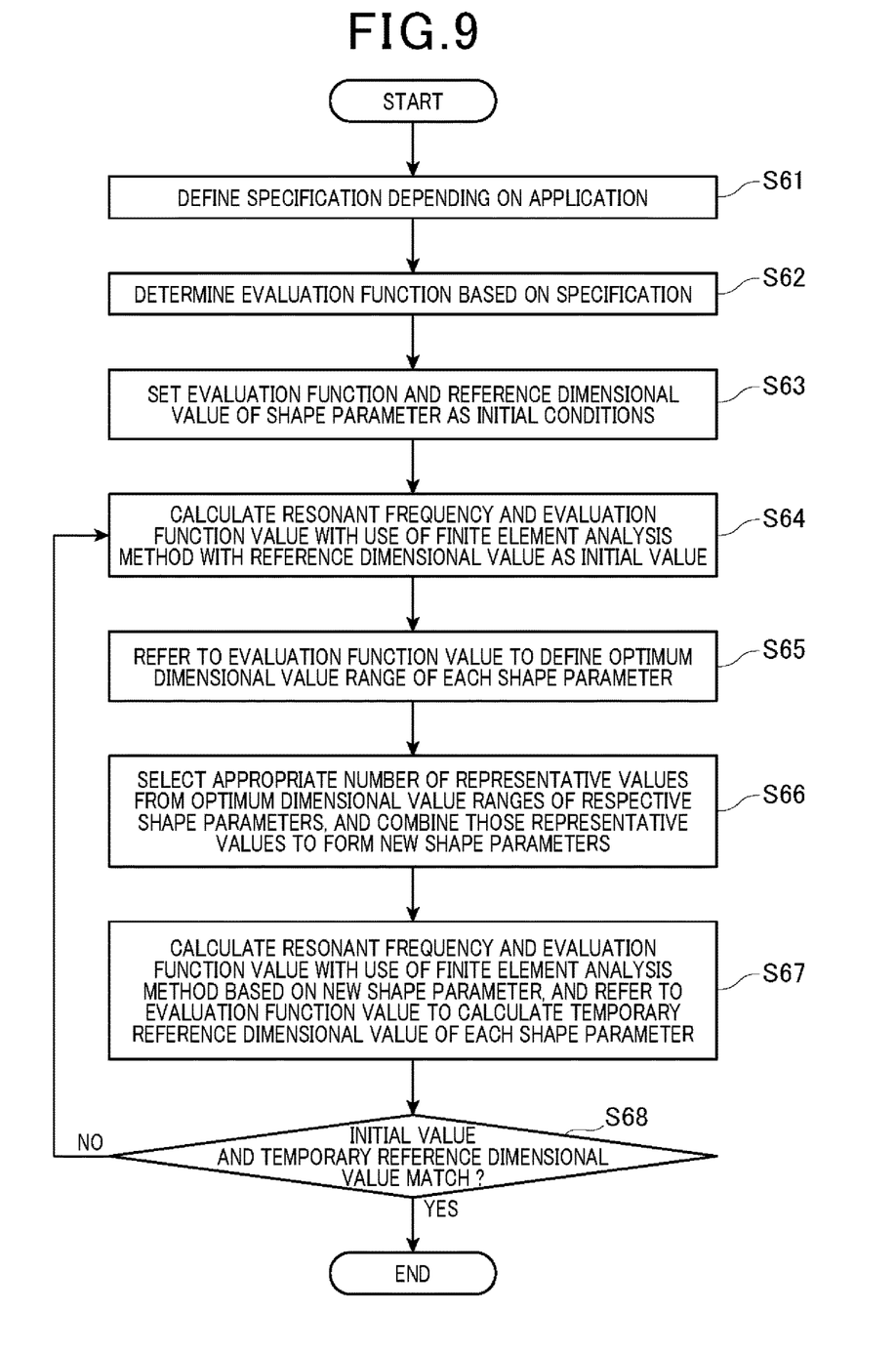
FIG. 9 is a flow chart of calculating optimum values of shape parameters.

FIG. 9 is a flowchart of calculating the optimum values of the shape parameters in the finite element analysis of the micro drive unit 51 for a light scanner so as to optimally set different resonant frequencies corresponding to the respective degrees of freedom. Now, the procedure of selecting the shape parameters is described along with the procedure of the flow chart of FIG. 9.

S61 is a process of defining the specification depending on the application of the micro drive unit. Subsequently, in S62 that is an evaluation function deriving process, an evaluation function for evaluating the resonant frequency that changes depending on the analyzed shape parameter is determined. S63 is an initial condition setting process of setting a dimensional value that at least satisfies the specification as a reference (hereinafter referred to as "reference dimensional value"), and setting the above-mentioned evaluation function and the reference dimensional value as initial conditions.

S64 is a shape parameter changing process of selecting one of the shape parameters, changing only the selected shape parameter from the reference dimensional value at predetermined intervals while fixing the remaining shape parameters at their reference dimensional values, and calculating the resonant frequency and the evaluation function value at each interval with use of the finite element analysis method, which are performed for all of the shape parameters. In S64, an arbitrary shape parameter value cannot be taken, and hence the value is changed at appropriate intervals in each of the shape parameters.

S65 is an optimum dimensional value range calculating process of evaluating the resonant frequency calculated at each interval with the evaluation function value corresponding thereto, to thereby calculate an optimum dimensional value range of each shape parameter. S66 is a representative value combining process of selecting an appropriate value from the calculated optimum dimensional value range of each shape parameter, and combining all of those representative values to form a new combination of the shape parameters. S67 is a temporary reference value calculating process of executing S64 that is the shape parameter changing process with respect to the new combination of the shape parameters, and evaluating the resonant frequency calculated at each interval with the evaluation function value corresponding thereto, to thereby determine the combination of the temporary reference dimensional values.

S68 is an optimum value calculating process of setting the combination of the temporary reference dimensional values obtained in S67 as new reference dimensional values of the shape parameters, and repeating S64 to S67 until the reference dimensional values and the temporary reference dimensional values match with each other. When the reference dimensional values and the temporary reference dimensional values match with each other in the first cycle, it is not necessary to repeat S64 to S67 again. Finally, in S68, when the reference dimensional values and the temporary reference dimensional values match with each other, the matched temporary reference dimensional values are considered as optimal dimensional values.

With the above-mentioned method of optimizing the resonant frequency, in this embodiment, the optimized shape parameters to be used for the micro drive unit 51 for a light scanner were set to the beam width $W_Q$ of 80 µm, the beam width $W_P$ of 10 µm, the length $l_p$ of 400 µm, and the interval $P_{12}$ of 25 µm. Further, in the micro drive unit 51 for a light scanner having those shape parameters, the following results were obtained. That is, the x-axis rotation resonant frequency $f_x$ was 4.341 kHz, the y-axis rotation resonant frequency $f_y$ was 33.74 kHz, and the z-axis translation resonant frequency $f_z$ was 19.68 kHz.

<Method of Manufacturing Micro Drive Unit>

Figure 10:
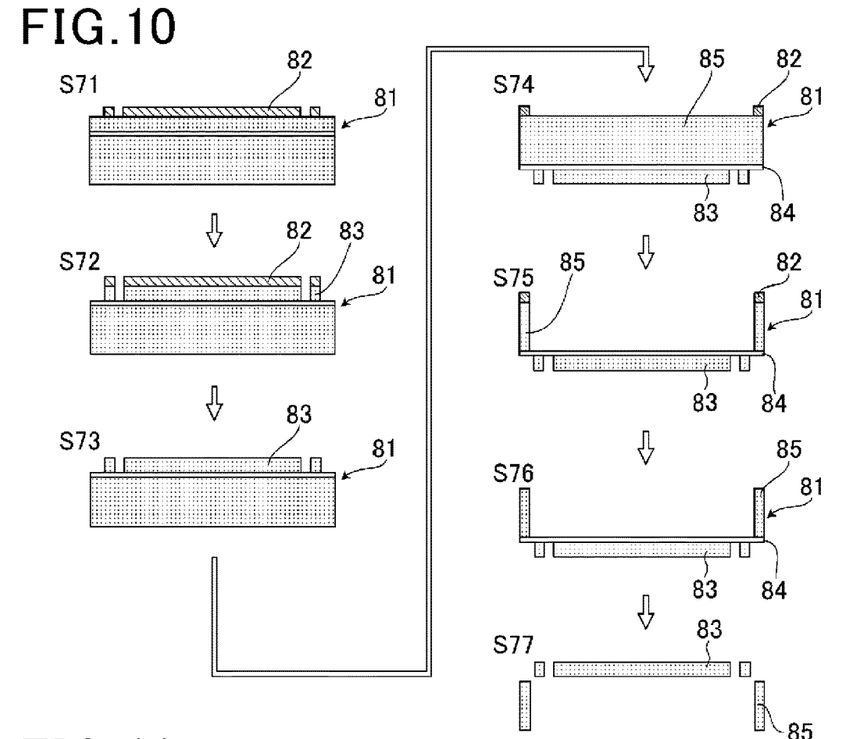
FIG. 10 is a process diagram for illustrating a method of manufacturing a micro drive unit.

How to manufacture the micro drive unit 51 for a light scanner is described based on a process diagram of FIG. 10. In this embodiment, it is necessary to etch the substrate from the front side and the back side in consideration of the three-dimensional displacement of the movable object, and hence a silicon on insulator (SOI) substrate is used. This is because a $SiO_2$ layer formed between the substrate front surface and the substrate back surface serves as a stopper at the time of Si etching, and hence etching from the substrate back surface can be performed while maintaining the shape formed on the substrate front surface.

The used SOI wafer includes three layers, specifically, a silicon layer of 30 µm (hereinafter referred to as "front surface"), a $SiO_2$ layer of 2 µm, and a silicon layer of 250 µm (hereinafter referred to as "back surface"). In S71 illustrated in FIG. 10, a surfactant OAP (TOKYO OHKA KOGYO CO., LTD.) was applied by spin coating on a SOI substrate 81 and then dried, and then OFPR (TOKYO OHKA KOGYO CO., LTD.) serving as a positive photoresist 82 was applied thereon by spin coating. On the applied positive photoresist 82, the pattern of the micro drive unit 51 for a light scanner drawn on a photomask was printed by ultraviolet irradiation. The SOI substrate 81 subjected to exposure was immersed into a developer, to thereby remove an unnecessary photoresist 82 other than the printed pattern.

In S72, Si etching was performed to reach a $SiO_2$ layer 84 in order to transfer the printed pattern onto a Si upper layer 83 of the substrate, and the pattern was formed on the Si upper layer 83. The Si etching was performed by dry etching using $SF_6$, oxygen, and $C_4F_8$. Dry etching was used in this case, but, for example, wet etching may be used.

In S73, the photoresist 82 remaining on the pattern of the Si upper layer 83 was removed with use of a solvent or the like. A solvent of any type may be used as long as the solvent can be used for photoresist removal. In this case, the resist was removed with use of acetone, isopropanol, and a sulfuric acid/hydrogen peroxide mixture.

In S74 to S76, similarly to S71 to S73, from the back surface side of the SOI substrate 81, a pattern of the substrate back surface side was formed by Si-etching a Si lower layer 85 to reach the $SiO_2$ layer 84.

Figure 11:
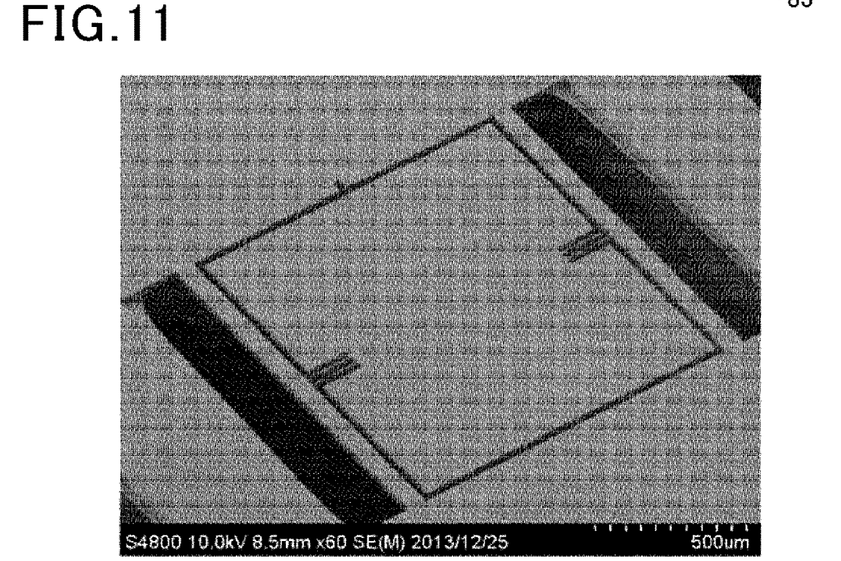
FIG. 11 is a model diagram of the manufactured micro drive unit for a light scanner.

In S77, the $SiO_2$ layer was removed. In this case, a hydrofluoric acid aqueous solution was used, but it is only required to etch only the $SiO_2$ layer without etching the Si layer, and hence, for example, dry etching may be used. FIG. 11 is the micro drive unit for a light scanner according to the second embodiment, which is manufactured through respective S71 to S77 illustrated in the process diagram.

[Evaluation of Micro Drive Unit]

(Evaluation Method)

In order to evaluate the characteristics of the manufactured micro drive unit for a light scanner, this micro drive unit was oscillated to measure the displacement in the z-axis direction at certain points at that time. With this, it was evaluated whether the micro drive unit for a light scanner represented three types of modes at the resonant frequencies as in the specification.

Figure 12:
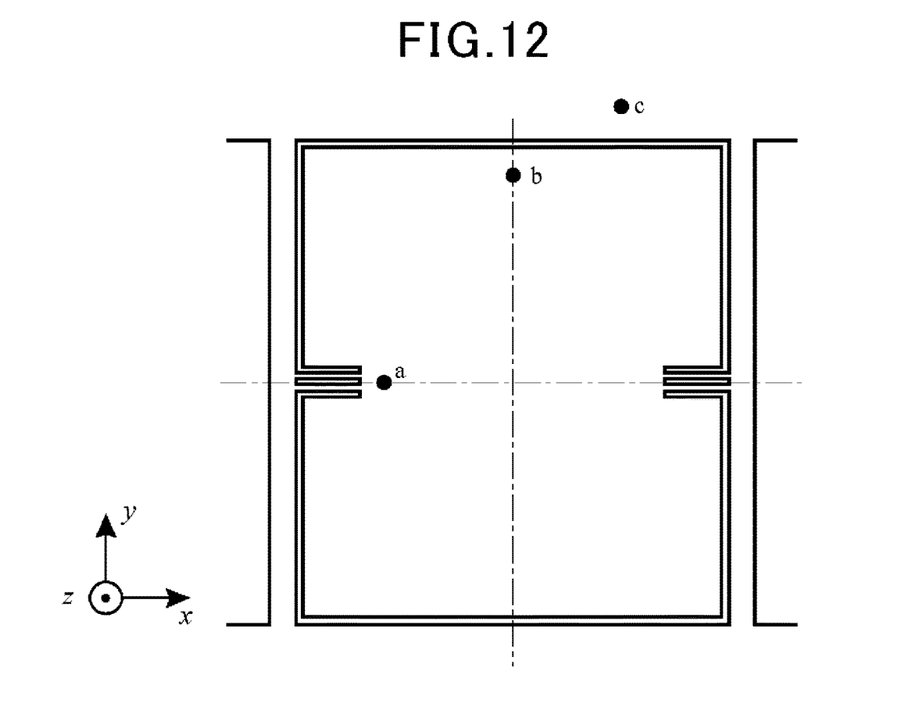
FIG. 12 is a schematic view for illustrating measurement positions in an evaluation experiment.

FIG. 12 is a schematic view of a two-dimensional shape of the micro drive unit for a light scanner as viewed from the z-axis direction. As illustrated in FIG. 12, three points a, b, and c were set as the measurement points. The measurement point c was set outside of the micro drive unit for alight scanner because an external mechanism supporting the micro drive unit also vibrates during oscillation, and this external vibration needs to be subtracted to obtain a pure displacement of the mirror portion of the micro drive unit for a light scanner during oscillation.

With the measurement of the displacement at the measurement points a and b, the following matters can be determined. When the measurement point a is not displaced but the measurement point b is displaced, it can be determined that the mirror portion is performing x-axis rotation. Further, when the measurement points a and b are displaced, it can be determined that the mirror portion is performing z-axis translation. When the measurement point a is displaced but the measurement point b is not displaced, it can be determined that the mirror portion is performing y-axis rotation.

In the measurement of the displacement at the measurement points, a laser Doppler vibrometer (manufactured by Polytec Inc., MSA-500) was used. Further, a piezoelectric actuator was used as an oscillator to oscillate the micro drive unit for a light scanner. During the oscillation, in order to support the micro drive unit for a light scanner, which was manufactured in 20 mm square, the micro drive unit was fixed on the piezoelectric actuator with an aluminum sheet sandwiched therebetween. The laser Doppler vibrometer can measure as many displacements as the number of points specified in a specified range. Only the displacements at the above-mentioned three measurement points were extracted to measure the resonant frequencies and the resonant modes at the three measurement points. The drive voltage during oscillation was set to 2 V in half amplitude.

(Evaluation Result)

Figure 13A:
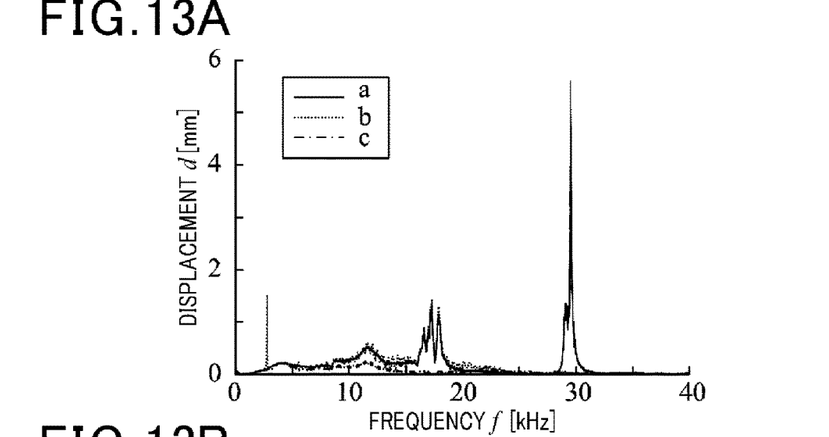
FIG. 13A is a graph in which a change in resonant frequency and a change in displacement at measurement points are plotted.
Figure 13B:
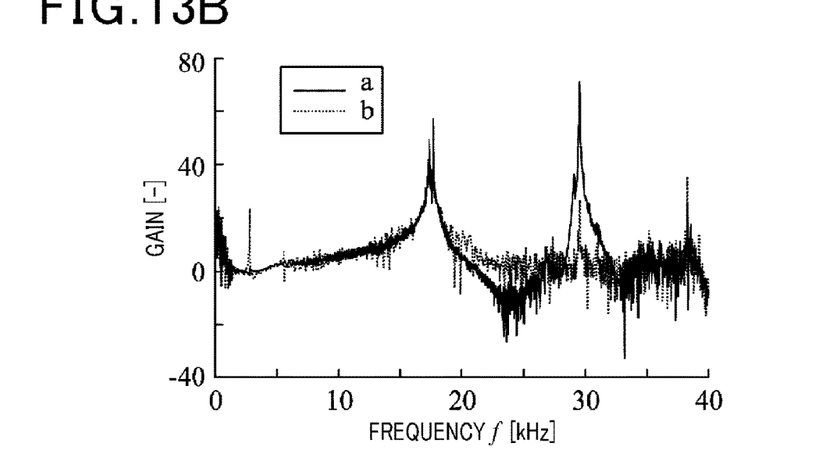
FIG. 13B is a graph in which a change in resonant frequency and a change in gain at measurement points a and b are plotted.

The manufactured micro drive unit for a light scanner was evaluated in characteristics as the micro drive unit for a light scanner in accordance with the above-mentioned evaluation method. FIG. 13A is a graph for showing a relationship between a frequency applied to the micro drive unit for a light scanner and its displacement (frequency-displacement graph). FIG. 13B is a graph for showing a relationship between a gain and a frequency calculated by subtracting the external displacement applied to the micro drive unit for a light scanner (frequency-gain graph).

From the frequency-displacement graph of FIG. 13A, it is understood that, in the order from the lower frequency peak, only the measurement point b is displaced, the measurement points a and b are displaced, and then only the measurement point a is displaced. Referring to the frequency-gain graph of FIG. 13B, in the vicinity of the resonant frequency corresponding to the lowest peak of the frequency-displacement graph, only the displacement component of the measurement point b is present. Further, in the vicinity of the resonant frequency corresponding to the center peak of the frequency-displacement graph, the displacement components of the measurement points a and b overlap with each other at the same strength.

Further, it is understood that, in the vicinity of the resonant frequency corresponding to the highest peak of the frequency-displacement graph, there are some resonant frequencies having high displacement components of the measurement point b, but most resonant frequencies have displacement components of the measurement point a. Based on this evaluation result, an independent resonant frequency corresponding to the movement in each axis was selected.

Figure 14:
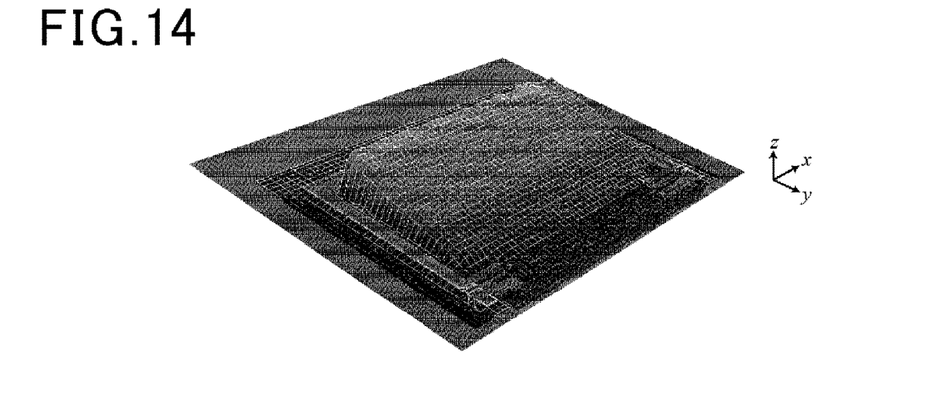
FIG. 14 is a graphic for showing the manufactured micro drive unit for a light scanner causing x-axis rotation.
Figure 15:
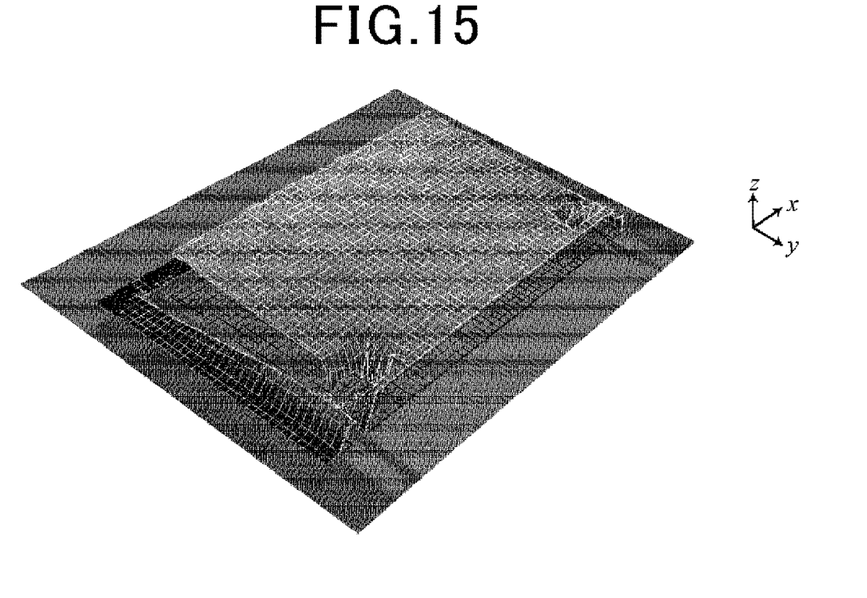
FIG. 15 is a graphic for showing the manufactured micro drive unit for a light scanner causing z-axis translation.
Figure 16:
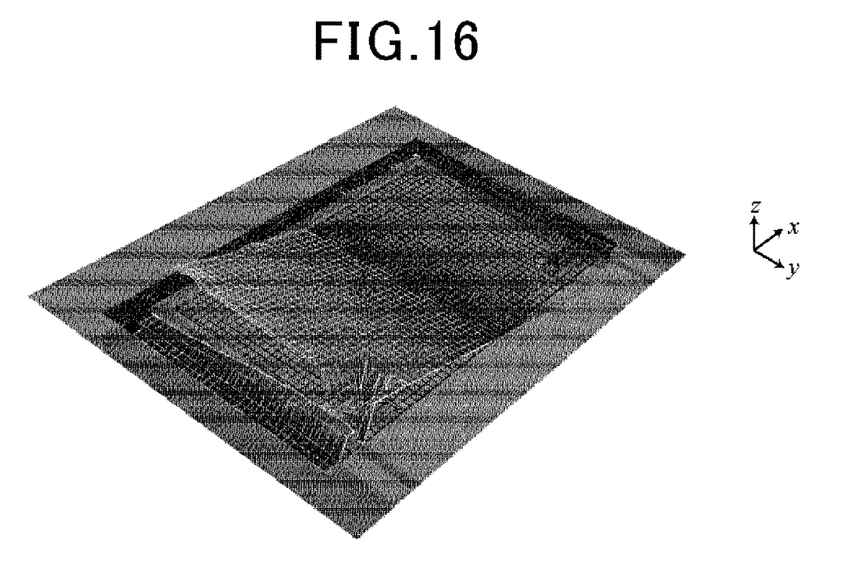
FIG. 16 is a graphic for showing the manufactured micro drive unit for a light scanner causing y-axis rotation.

Subsequently, the state of driving the micro drive unit for a light scanner, which was performed at the selected resonant frequency, is shown in FIG. 14 to FIG. 16 in 3D graphics. When the micro drive unit for a light scanner is oscillated at the resonant frequency of 2.781 kHz in the vicinity of the lowest peak at which only the measurement point b is displaced, an x-axis rotation mode was obtained as shown in FIG. 14. This result represents that the x-axis rotation is performed at a frequency close to the x-axis rotation resonant frequency $f_x$ obtained by the method of optimizing the resonant frequency.

Further, when the micro drive unit for a light scanner is oscillated at the resonant frequency of 17.31 kHz in the vicinity of the center peak at which the displacement components of the measurement points a and b overlap with each other at the same strength, a z-axis translation mode was obtained as shown in FIG. 15. This result represents that the z-axis translation is performed at a frequency close to the z-axis translation resonant frequency $f_z$ obtained by the method of optimizing the resonant frequency.

Further, when the micro drive unit for a light scanner is oscillated at the resonant frequency of 29.50 kH in the vicinity of the highest peak at which only the measurement point a is displaced, a y-axis rotation mode was obtained as shown in FIG. 16. This result represents that the y-axis rotation is performed at a frequency close to the y-axis rotation resonant frequency $f_y$ obtained by the method of optimizing the resonant frequency.

In the above-mentioned configuration, the micro drive unit of the present invention includes the first beams P and the second beams Q formed so as to be orthogonal to each other, and three different resonant frequencies can be optimally obtained when the shape parameters are optimized. Therefore, when the first beams P and the second beams Q are twisted or bent based on each resonant frequency, the movable object can perform x-axis rotation, y-axis rotation, and z-axis translation. Therefore, the micro drive unit for a light scanner formed of the micro drive unit of the present invention can be downsized with simple structure, and can also have a focusing function due to the z-axis translation. Further, the mirror portion can be maximally enlarged on the inner side of the frame portion, and hence the aperture ratio can be increased.

Third Embodiment

In the first and second embodiments, there has been described a micro drive unit obtained by subjecting the SOI substrate to etching, to thereby form the frame portion, the movable object, the first beams, and the second beams. Those components are made of silicon. In a micro drive unit according to a third embodiment of the present invention, in order to enable usage of different materials for the above-mentioned components, as the manufacturing method, a laminating process, e.g., vapor deposition is added to the etching, so that the material to be used for each of those components can be laminated. When such materials are used for the components, a material parameter can be added, and further resonant frequency optimization can be expected.

Examples of the materials usable for the micro drive unit of the third embodiment include metal materials such as gold, silver, and aluminum, inorganic materials such as carbon and a metal oxide, and organic materials such as polyamide, epoxy resin, and silicone resin. Any of those materials may be used as long as the material can be used during microfabrication. Further, instead of forming each component with a single material, such a composite material that a plurality of materials are laminated can be used as the material for the component to form each component.

In the above-mentioned configuration different from those of the first and second embodiments, the micro drive unit of the third embodiment is manufactured such that at least one of the frame portion, the movable object, the first beams, or the second beams is made of a different material. Therefore, a parameter that can control the resonant frequency is added. As a result, the interval between the respective resonant frequencies can be increased. In this manner, in such a micro drive unit that the movable object and the first beam are made of an organic material, and the frame portion and the second beam are made of metal or an inorganic material, for example, the period of the x-axis rotation can be set slow, while the period of the y-axis rotation and the period of the z-axis translation can be set very fast. Further, the micro drive unit of the third embodiment may be designed so as to include the first beam and/or the second beam having a plurality of divided parts, and such that a part of the divided parts is made of a material different from that of other parts.

[Micro Device]

By incorporating the micro drive unit of the present invention, a micro device capable of achieving multi-axis drive can be manufactured. When the micro device is manufactured by changing the movable object depending on the usage application of the micro device and by selecting the arrangement method and the material of the first beams and the second beams depending on the necessary degrees of freedom, a desired micro device can be obtained. An example of the micro device is not limited to a micro mirror including a mirror as the movable object, and there may be given micro machines and micro sensors, which perform multi-axis drive and include, as the movable object, mechanical components such as a shaft and an arm and sensors such as a pressure sensor and an optical sensor.

[Program for Determining Resonant Frequency for Micro Drive Unit]

The method of optimizing the resonant frequency, which is applied when the micro drive unit of the present invention is manufactured, can be achieved by computer processing. A CPU can load a program into a RAM for causing a computer to execute the method of optimizing the resonant frequency of the micro drive unit, and the computer can execute the above-mentioned method of optimizing the resonant frequency in accordance with the program. The program may be installed into the computer with use of a computer-readable storage medium, or may be installed from other computers or storage media via a network.

The embodiments of the present invention are described above. However, those embodiments are presented as examples and are not intended to limit the scope of the invention. Those embodiments may be implemented in other various modes, and various kinds of omissions, replacements, and modifications can be made without departing from the gist of the invention.

The micro drive unit of the invention of the subject application includes the beams formed only in one direction, is capable of performing multi-axis drive, and is a downsized unit. Therefore, the micro drive unit is applicable to a micro device that requires microminiaturization and microfabrication. Therefore, the micro drive unit of the present invention can contribute to development of electronic device related industries. Further, the micro mirror drive unit including a mirror as the movable object can be used in various sensors, e.g., an optical sensor, and can be employed in a MEMS light scanner or the like. Therefore, the micro drive unit of the present invention can greatly contribute to development of electronic optical device industries. Further, when the light scanner using the micro drive unit according to the invention of the subject application is applied to a head mounted display, the head mounted display can display not only a two-dimensional image as in the related art but also a three-dimensional image, and thus image technologies can be improved.

The invention claimed is:

1. A micro drive unit, which is capable of performing multi-axis drive, the micro drive unit comprising:
   a mirror; and
   first beams configured to pivotally support the mirror from two opposite sides of the mirror and formed only in a first direction,
   the mirror being configured to rotate around an x-axis direction and a y-axis direction in a mirror surface, and to translate in a z-axis direction that is a normal direction to the mirror surface in a state the mirror not rotating, when the first beams is twisted or bent at one or a plurality of resonant frequencies of the first beams.

2. The micro drive unit according to claim 1, wherein the micro drive unit further comprises:
   second beams formed in a second direction different from the first direction and each of the second beams being connected to the one of the first beams at a first end, and connected to the mirror or to a frame of the micro drive unit at a second end opposite to the first end.

3. The micro drive unit according to claim 1, wherein a drive signal for oscillating the micro drive unit at the one or the plurality of resonant frequencies is generated by only one control mechanism.

4. The micro drive unit according to claim 2, wherein the first direction and the second direction are perpendicular to each other.

5. The micro drive unit according to claim 2, wherein the first beams and/or the second beams are divided into a plurality of parts.

6. The micro drive unit according to claim 2, wherein the first beams and the second beams are made of different materials.

7. The micro drive unit according to claim 5, wherein at least one of the plurality of divided parts of the first beams and/or the second beams are made of a material different from a material of other parts of the plurality of divided parts.

8. A micro device comprising:
   a micro drive unit which is capable of performing multi-axis drive,
   wherein the micro drive unit comprising,
   a mirror; and
   first beams configured to pivotally support the mirror from two opposite sides of the mirror and formed only in a first direction,
   the mirror being configured to rotate around an x-axis direction and a y-axis direction in a mirror surface, and to translate in a z-axis direction that is a normal direction to the mirror surface in a state the mirror not rotating, when the first beams is twisted or bent at one or a plurality of resonant frequencies of the first beams.

9. The micro device according to claim 8, wherein the micro drive unit further comprises:
   second beams formed in a second direction different from the first direction and each of the second beams being connected to the one of the first beams at a first end, and connected to the mirror or to a frame of the micro drive unit at a second end opposite to the first end.

* * * * *